(12) United States Patent
Lee et al.

(10) Patent No.: US 9,082,468 B2
(45) Date of Patent: Jul. 14, 2015

(54) HIGH DENSITY SEMICONDUCTOR MEMORY DEVICES

(71) Applicants: Jaekyu Lee, Yongin-si (KR); Youngmin Kang, Seoul (KR); Hyunju Lee, Seoul (KR)

(72) Inventors: Jaekyu Lee, Yongin-si (KR); Youngmin Kang, Seoul (KR); Hyunju Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 420 days.

(21) Appl. No.: 13/692,157

(22) Filed: Dec. 3, 2012

(65) Prior Publication Data

US 2013/0141965 A1 Jun. 6, 2013

(30) Foreign Application Priority Data

Dec. 2, 2011 (KR) .................. 10-2011-0128366

(51) Int. Cl.
| | |
|---|---|
| *G11C 8/00* | (2006.01) |
| *G11C 8/10* | (2006.01) |
| *G11C 11/16* | (2006.01) |
| *G11C 8/08* | (2006.01) |

(52) U.S. Cl.
CPC .. *G11C 8/10* (2013.01); *G11C 8/08* (2013.01); *G11C 11/16* (2013.01); *G11C 11/1653* (2013.01)

(58) Field of Classification Search
CPC ............ G11C 8/08; G11C 8/10; G11C 11/16; G11C 11/4063; G11C 5/04; G11C 5/025; G11C 11/406
USPC ............. 365/51, 63, 230.06, 230.03, 189.05, 365/185.05, 185.18, 185.23, 171, 175
See application file for complete search history.

(56) References Cited

U.S. PATENT DOCUMENTS

| | | | |
|---|---|---|---|
| 6,680,501 B2 | 1/2004 | Ito et al. | |
| 6,818,937 B2 | 11/2004 | Noble et al. | |
| 6,845,028 B2 * | 1/2005 | Takemura | 365/63 |
| 6,861,314 B2 * | 3/2005 | Hosotani | 438/257 |
| 7,285,812 B2 | 10/2007 | Tang et al. | |
| 7,569,876 B2 | 8/2009 | Forbes | |
| 7,736,969 B2 | 6/2010 | Abbott et al. | |
| 7,768,051 B2 | 8/2010 | Abbott | |
| 7,824,982 B2 | 11/2010 | Forbes | |
| 7,902,598 B2 | 3/2011 | Juengling | |
| 8,023,352 B2 | 9/2011 | Masuoka et al. | |
| 8,644,064 B2 * | 2/2014 | Cho et al. | 365/185.02 |
| 8,727,124 B2 * | 5/2014 | Franciskovich et al. | 206/593 |
| 2010/0219469 A1 | 9/2010 | Min et al. | |

FOREIGN PATENT DOCUMENTS

JP  2008-034660 A  2/2008

* cited by examiner

*Primary Examiner* — Gene Auduong
(74) *Attorney, Agent, or Firm* — Sughrue Mion, PLLC

(57) ABSTRACT

High density semiconductor memory devices are provided. The device may include a cell array region including a lower structure, an upper structure, and a selection structure, the selection structure being interposed between the lower and upper structures and including word lines, and a decoding circuit controlling voltages applied to the word lines. The decoding circuit may be configured to apply a first voltage to a pair of the word lines adjacent to each other and to apply a second voltage different from the first voltage to the remaining ones of the word lines, in response to word line address information input thereto.

32 Claims, 20 Drawing Sheets

HIGH DENSITY SEMICONDUCTOR MEMORY DEVICES

CROSS-REFERENCE TO RELATED APPLICATIONS

This U.S. non-provisional patent application claims priority under 35 U.S.C. §119 to Korean Patent Application No. 10-2011-0128366, filed Dec. 2, 2011, in the Korean Intellectual Property Office, the entire contents of which are hereby incorporated by reference.

BACKGROUND

1. Field

Apparatuses consistent with exemplary embodiments relate to semiconductor memory devices, and more particularly, to high density semiconductor memory devices.

2. Description of the Related Art

Higher integration of semiconductor memory devices is required to satisfy consumer demands for superior performance and inexpensive prices. In the case of semiconductor memory devices, since their integration is an important factor in determining product prices, increased integration density is required.

For semiconductor memory devices, a metal-oxide-semiconductor (MOS) transistor with a horizontal channel is used as a switching device, and in this case, a unit cell has a cell size ranging from 6F2 to 8F2 (where F is the minimum feature size). Using a diode as the switching device may allow reducing the cell size to about 4F2. In this case, however, due to a rectifying property of the diode, it may suffer from a technical difficulty in realizing a bi-directional current characteristic.

SUMMARY

One or more exemplary embodiments of the inventive concept provide a semiconductor device, in which a selection device has a reduced occupying area.

One or more exemplary embodiments of the inventive concept also provide a semiconductor device, in which a selection device has a reduced occupying area and a bi-directional current characteristic.

According to an aspect of an exemplary embodiment, a semiconductor memory device may include a cell array region including a lower structure, an upper structure, and a selection structure, the selection structure being interposed between the lower and upper structures and including a plurality of word lines, and a decoding circuit controlling voltages applied to the word lines. The decoding circuit may be configured to apply a first voltage to a pair of the word lines adjacent to each other and to apply a second voltage different from the first voltage to remaining ones of the word lines, in response to word line address information input thereto.

In an exemplary embodiment, the decoding circuit may include a plurality of decoders, each of which is configured to apply the first voltage to a corresponding one of the word lines, if the word line address information input thereto is greater by one than or equal to address information of the each decoder, and to apply the second voltage to the corresponding one of the word lines if the word line address information input thereto is less than the address information of the each decoder.

In an exemplary embodiment, the lower structure may include a semiconductor substrate and a lower doped region provided above the semiconductor substrate, and the selection structure may further include a plurality of active patterns arranged on the lower structure. Each of the active patterns may include an upper impurity region having the same conductivity type as the lower doped region and a channel region interposed between the upper impurity region and the lower doped region.

In an exemplary embodiment, a ratio of a vertical length of the channel region to a horizontal width thereof may range from about 3 to about 20.

In an exemplary embodiment, the first and second voltages may have different signs from each other, and an absolute value of the first voltage may be smaller than that of the second voltage.

In an exemplary embodiment, one of the lower and upper structures may include a common electrode, and the other may include a plurality of memory elements and a plurality of bit lines. The selection structure may be located between the common electrode and the memory elements, in vertical position.

In an exemplary embodiment, the upper structure may include a plurality of memory elements and a plurality of bit lines, and the selection structure may further include a plurality of active patterns arranged on the lower structure. The word lines may be disposed between the active patterns to cross the bit lines, and the lower structure may include a common electrode, to which the active patterns may be coupled.

In an exemplary embodiment, the upper structure may further include a plurality of vertical electrodes, each of which may be coupled to a corresponding one of the active patterns, and the memory elements may be provided at intersections between the vertical electrodes and the bit lines, respectively.

In an exemplary embodiment, all of the memory elements may be substantially provided on a single plane parallel to a top surface of the lower structure, and the bit lines may be disposed on the memory elements.

In an exemplary embodiment, the memory elements may be three-dimensionally arranged on a plurality of planes parallel to a top surface of the lower structure, the bit lines may be provided to cross sidewalls of the vertical electrodes, and the memory elements may be provided between sidewalls of the bit lines and the vertical electrodes.

In an exemplary embodiment, in the cell array region, a ratio of a total number of the active patterns to a total number of the vertical electrodes may range from 0.9 to 1.1.

In an exemplary embodiment, the memory elements may include at least one of chalcogenides, at least one of layered structures configured to exhibit a magneto-resistance property, at least one of perovskite compounds, or at least one of transition metal oxides.

According to an aspect of another exemplary embodiment, a semiconductor memory device may include a lower structure including a lower electrode, an upper structure including a plurality of memory elements and a plurality of bit lines, a selection structure provided between the lower and upper structures and including a plurality of word lines, and a plurality of word line decoders controlling voltages applied to the word lines. Each of the word line decoders may be configured to apply a first or second voltage to a corresponding one of the word lines connected thereto in response to word line address information input thereto. The first voltage may be used if the word line address information input thereto is greater by one than or equal to address information of the each word line decoder, and the second voltage is different from the first voltage and is used if the word line address information input thereto is less than the address information of the each word line decoder.

In an exemplary embodiment, the first and second voltages have different signs from each other, and an absolute value of the first voltage may be smaller than that of the second voltage.

In an exemplary embodiment, the selection structure may include a plurality of active patterns arranged on the lower structure, and each of the active patterns may include an upper electrode and a channel region interposed between the lower and upper electrodes. The channel region may have the same conductivity type as the lower and upper electrodes.

According to an aspect of another exemplary embodiment, a semiconductor memory device may include a lower structure including a lower electrode, an upper structure including a plurality of memory elements and a plurality of bit lines, and a selection structure provided between the lower and upper structures. The selection structure may include a plurality of active patterns arranged on the lower structure and a plurality of word lines provided between the active patterns to cross the bit lines, each of the active patterns may include a channel region and an upper electrode sequentially stacked on the lower electrode, and the channel region may have the same conductivity type as the upper and lower electrodes.

In an exemplary embodiment, the device may further include a plurality of word line decoders, each of which may be configured to apply a first or second voltage to a corresponding one of the word lines connected thereto, in response to word line address information input thereto. The first voltage may be used if the word line address information input thereto is greater by one than or equal to address information of the each word line decoder, and the second voltage is different from the first voltage and is used if the word line address information input thereto is less than the address information of the each word line decoder.

BRIEF DESCRIPTION OF THE DRAWINGS

Example embodiments will be more clearly understood from the following brief description taken in conjunction with the accompanying drawings.

FIG. 1 is a perspective view schematically illustrating a cell array region of a semiconductor memory device according to an exemplary embodiment;

FIG. 2 is a perspective view illustrating lower and selection structures of the semiconductor memory device of FIG. 1, according to an exemplary embodiment;

FIGS. 3 and 4 are sectional views taken along lines I-I and II-II, respectively, of FIG. 2, according to an exemplary embodiment;

FIG. 5 is a perspective view illustrating lower and selection structures of the semiconductor memory device of FIG. 1, according to another exemplary embodiment;

FIG. 6 is a sectional view taken along line I-I of FIG. 5, according to an exemplary embodiment;

FIG. 7 is a plan view illustrating a method of operating a semiconductor memory device according to an exemplary embodiment;

FIGS. 8 and 9 are block diagrams schematically illustrating configurations of word line decoders according to exemplary embodiments;

FIG. 10 is a flow chart illustrating one of operations, which may be performed in each word line decoder, according to an exemplary embodiment;

FIGS. 11 and 12 are diagrams showing results of simulation on transistor characteristics of the semiconductor memory device according to exemplary embodiments;

FIG. 13 is a circuit diagram schematically illustrating a portion of a cell array region of a semiconductor memory device according to exemplary embodiments of inventive concept;

FIG. 14 is a perspective view illustrating an exemplary of the semiconductor memory device of FIG. 13, according to an exemplary embodiment;

FIG. 15 is a circuit diagram schematically illustrating a portion of a cell array region of a semiconductor memory device according to an exemplary embodiment;

FIG. 16 is a perspective view illustrating the semiconductor memory device of FIG. 15, according to an exemplary embodiment;

FIG. 17 is a circuit diagram illustrating a portion of a cell array of a semiconductor memory device according to an exemplary embodiment;

FIG. 18 is a perspective view illustrating the semiconductor memory device of FIG. 17, according to an exemplary embodiment;

FIG. 19 is a circuit diagram illustrating a portion of a cell array of a semiconductor memory device according to exemplary embodiment;

FIG. 20 is a perspective view illustrating the semiconductor memory device of FIG. 19, according to an exemplary embodiment; and FIGS. 21 and 22 are block diagrams schematically illustrating electronic devices including a semiconductor device according to exemplary embodiments.

Figure 1:
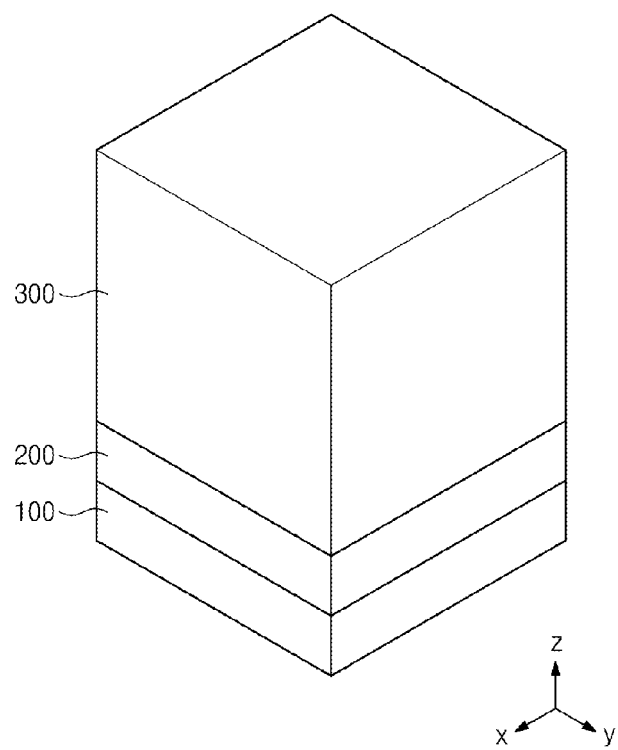
FIGS. 1 through 22 represent non-limiting, exemplary embodiments as described herein.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by the embodiment. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments will now be described more fully with reference to the accompanying drawings, in which exemplary embodiments are shown. Exemplary embodiments may, however, be embodied in many different forms and should not be construed as being limited to the embodiments set forth herein; rather, these embodiments are provided so that this disclosure will be thorough and complete, and will fully convey the inventive concept to those of ordinary skill in the art. In the drawings, the thicknesses of layers and regions are exaggerated for clarity. Like reference numerals in the drawings denote like elements, and thus, their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view schematically illustrating a cell array region of a semiconductor memory device according to an exemplary embodiment.

Referring to FIG. 1, a cell array region of a semiconductor memory device may include a lower structure 100, an upper structure 300 on the lower structure 100, a selection structure 200 between the lower structure 100 and the upper structure 300.

The lower structure 100 may serve as a base structure for forming the selection structure 200 and the upper structure 300. For example, the lower structure 100 may be configured to include at least one of semiconductors, dielectrics, conductive materials, and/or any combination thereof. In an exemplary embodiment, the lower structure 100 may be a silicon wafer or a silicon substrate.

As will be described with reference to FIGS. 13 through 20, one of the lower and upper structures 100 and 300 may include memory elements and/or bit lines and the other may include a common electrode. The selection structure 200 may be configured to control a current path for electric signals between the lower structure 100 and the upper structure 200. For example, the selection structure 200 may include a plurality of active patterns and a plurality of word lines disposed between the active patterns to cross the bit lines.

Figure 2:
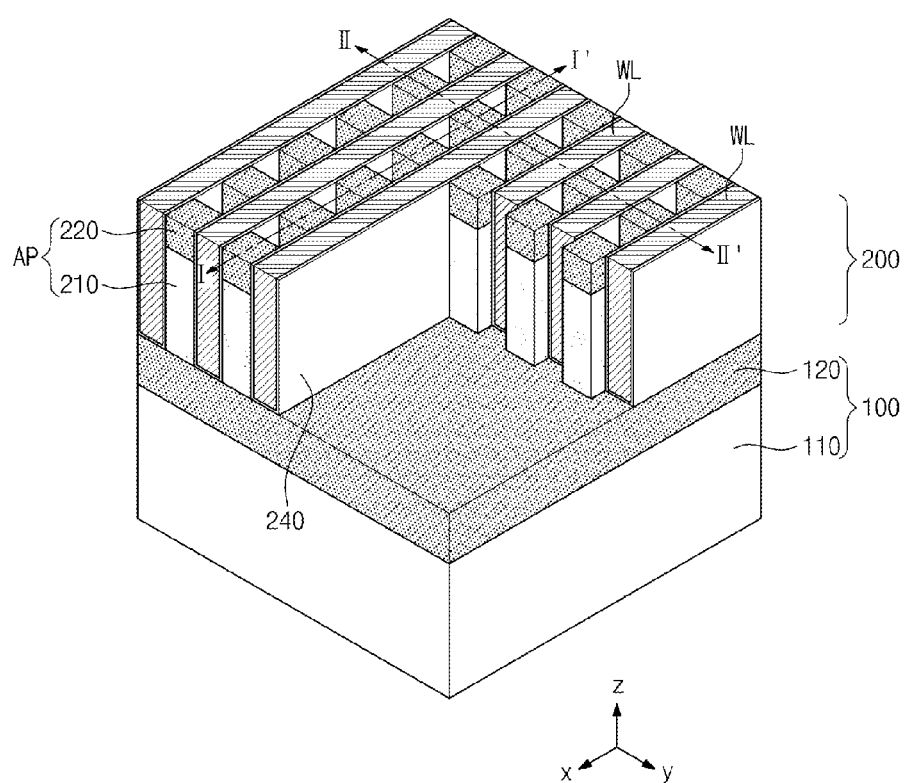
Figure 3:
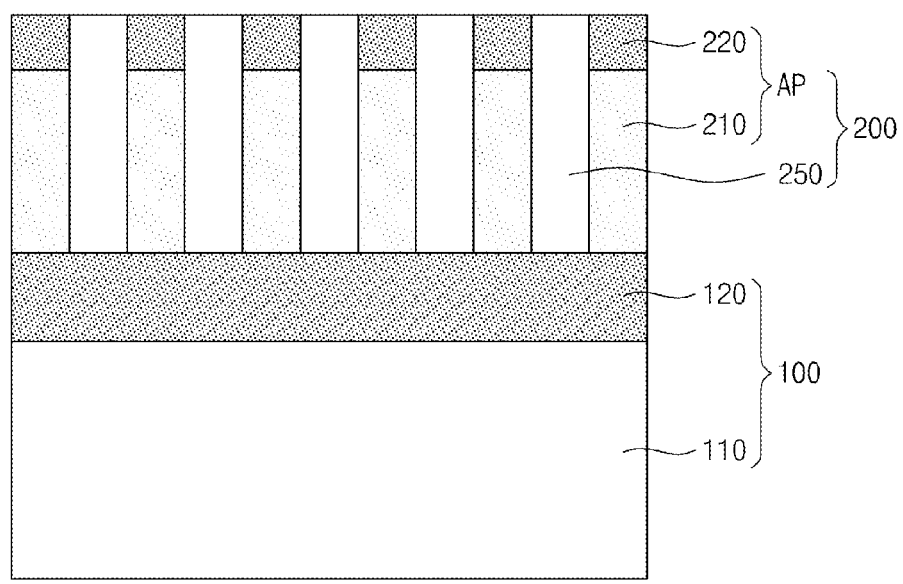
Figure 4:
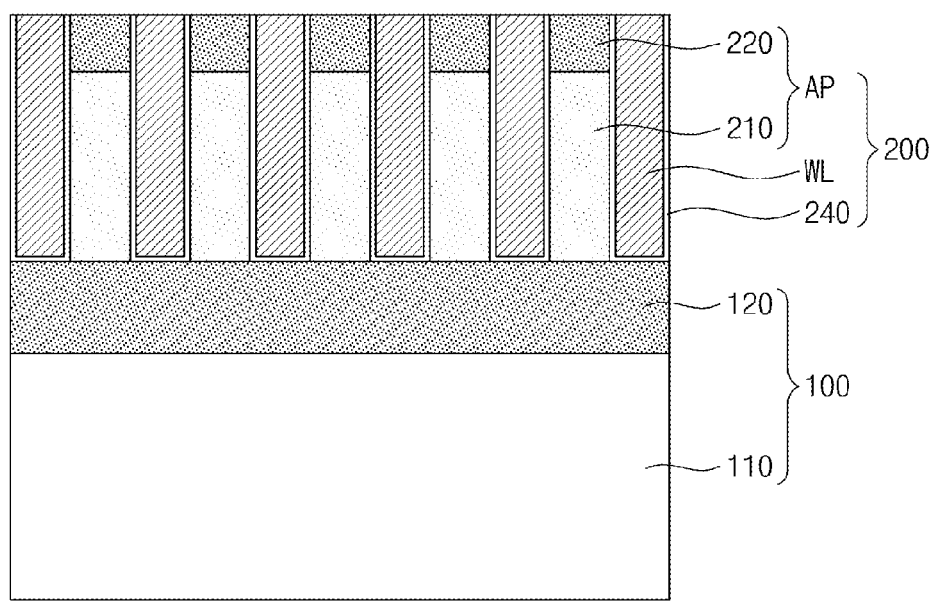

FIG. 2 is a perspective view illustrating lower and selection structures of the semiconductor memory device of FIG. 1, according to an exemplary embodiment, and FIGS. 3 and 4 are sectional views taken along lines I-I and II-II, respectively, of FIG. 2.

Referring to FIGS. 2 through 4, the lower structure 100 may include a substrate 110 and a plate-shaped lower electrode 120. The selection structure 200 may include active patterns AP two-dimensionally arranged on the lower electrode 120 and word lines WL provided between the active patterns AP.

The substrate 110 may be formed of at least one of semiconductors, dielectrics, conductive materials, and/or any combination thereof. In an exemplary embodiment, the substrate 110 may be a silicon wafer or a silicon substrate. The lower electrode 120 may transfer an electric signal (e.g., current or voltage) to the upper structure 300 via the active pattern AP. In an exemplary embodiment, the lower electrode 120 may be formed of at least one of materials, whose resistivity is lower than the substrate 110. For example, the lower electrode 120 may include at least one of doped semiconductor, metals, conductive metal nitrides, silicides, or nano structures (such as, carbon nano tube or graphene). In an exemplary embodiment, the substrate 110 may be a silicon substrate, and the lower electrode 120 may be a highly doped impurity region whose conductivity type is different from that of the silicon substrate. For example, the lower electrode 120 may be formed by doping the silicon substrate with impurities whose conductivity type is different from that of the silicon substrate.

Each of the active patterns AP may include a channel region 210 and an upper electrode 220. The upper electrode 220 and the channel region 210 may be formed of a semiconductor material. In an exemplary embodiment, the active patterns AP may be formed by patterning the substrate 110, and then, a width of each active pattern AP may be greater at a lower portion thereof than at an upper portion thereof. For example, each of the active patterns AP may be formed to have a rounded lower sidewall. In another exemplary embodiment, the active patterns AP may be patterns, which may be epitaxially grown using the substrate 110 as a seed layer, and an angle between a sidewall of each active pattern AP and a top surface of the lower electrode 120 may be substantially a right angle. In both exemplary embodiments, the active patterns AP may be directly connected to the top surface of the lower electrode 120, without any crystal defect.

The upper electrode 220 may have the same conductivity type as the lower electrode 120. In an exemplary embodiment, the channel region 210 may have the same conductivity type as the upper and lower electrodes 220 and 120, while the channel region 210 may have an impurity concentration lower than that of the upper and lower electrodes 220 and 120. In another exemplary embodiment, the channel region 210 may be formed of intrinsic semiconductor or have a different conductivity type from the upper and lower electrodes 220 and 120. In addition, an ohmic pattern (not shown), e.g., of silicide, may be further formed on the upper electrode 220.

In addition to the active patterns AP and the word lines WL, the selection structure 200 may further include device isolation patterns 250 spatially separating the active patterns AP from one another and gate insulating patterns 240 interposed between the word lines WL and the active patterns AP. As described above, the active patterns AP may be two-dimensionally arranged on the lower electrode 120, and each of them may have an island structure separated from the others. For example, the active patterns AP may be regularly arranged along x and y directions, as shown in FIG. 2.

The spatial separation between the active patterns AP may be substantially achieved by the word lines WL and the device isolation patterns 250. For example, the word lines WL may have longitudinal axes parallel to the x direction and be arranged along the y direction, such that the active patterns AP are separated from one another in the y direction. Each of the word lines WL may be formed to cross a plurality of the active patterns AP arranged along the x direction. For example, the plurality of the active patterns AP may be arranged in a row along the x direction between each pair of the word lines WL. The device isolation patterns 250 may be interposed between the active patterns AP, which may be arranged in a row along the x direction.

In other words, the active patterns AP may be spatially separated from one another by the device isolation patterns 250 in the x direction and by the word lines WL in the y direction. Here, a width of each of the device isolation patterns 250 in the y direction may be equal to that of each active pattern AP. In an exemplary embodiment, a width of the active pattern AP in the x direction may be also equal to that of the device isolation pattern 250. For example, the active patterns AP may be arranged at a pitch of $2X_0$ along the x direction (where $X_0$ denotes the width of the active pattern AP in the x direction). In an exemplary embodiment, a width of the active pattern AP in the y direction width may be substantially equal to a space between the active patterns AP in the y direction. In other words, the active patterns AP may be arranged at a pitch of $2Y_0$ along the y direction (where $Y_0$ denotes the width of the active pattern AP in the y direction). As a result, if the widths $X_0$ and $Y_0$ are the minimum feature size, which means a minimum pattern width realizable by patterning techniques to be used in fabricating the semiconductor device, an occupying area of a unit cell with one active pattern may be 4F2.

The device isolation pattern 250 may be formed of an insulating material, such as silicon oxide or silicon nitride. The gate insulating pattern 240 may be formed of at least one of silicon oxide or high-k dielectrics, whose dielectric constants are higher than, for example, that of silicon oxide. The gate insulating pattern 240 may extend horizontally from between sidewalls of the word lines WL and the active patterns AP to be interposed between the word lines WL and the lower electrode 120. A word line WL may include at least one of doped silicon or metallic materials. In an exemplary embodiment, the word lines WL may be formed of a material of which a work function is selected to allow the corresponding transistor to have a predetermined threshold voltage.

Figure 5:
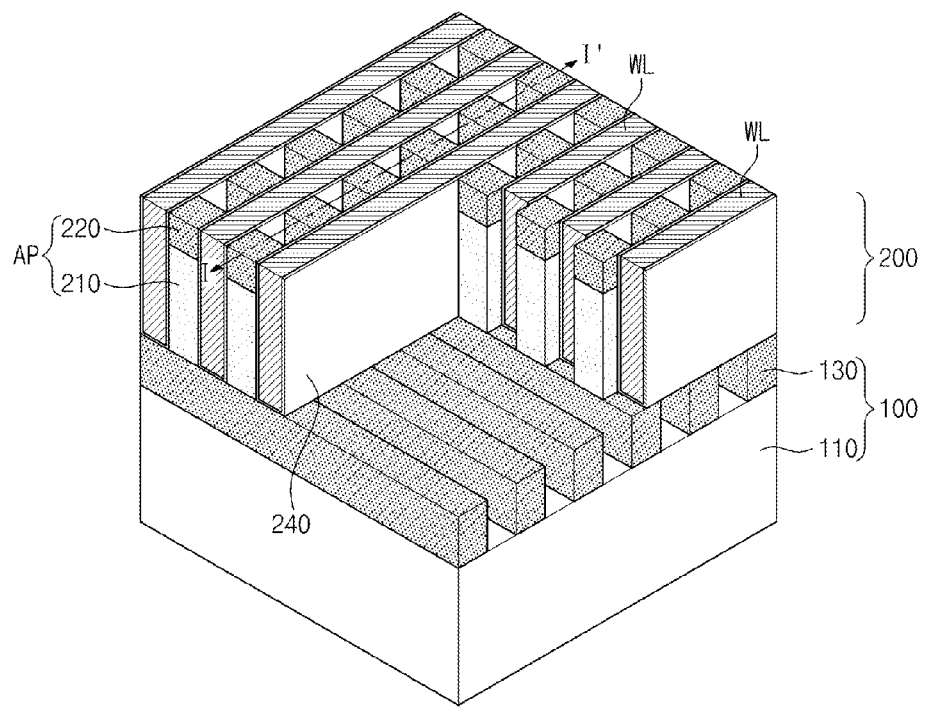
Figure 6:
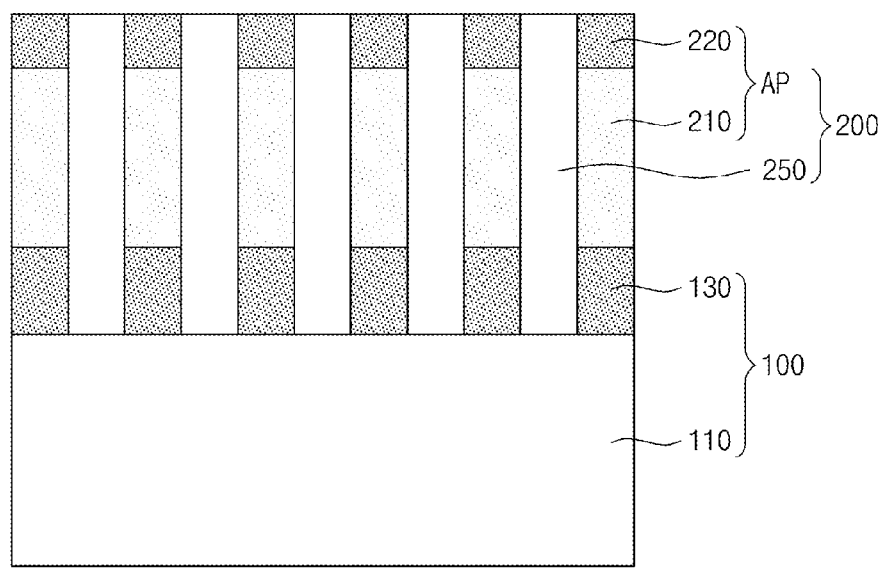

FIG. 5 is a perspective view illustrating lower and selection structures of the semiconductor memory device of FIG. 1, according to another exemplary embodiment, and FIG. 6 is a sectional view taken along line I-I of FIG. 5.

Referring to FIGS. 5 and 6, the lower structure 100 may include a plurality of lower electrodes 130 crossing the word lines WL. Each of the lower electrodes 130 may transfer an electric signal (e.g., current or voltage) to the upper structure 300 via the active patterns AP. Specifically, each of the lower electrodes 130 may transfer an electric signal to the upper structure 300 via a plurality of active patterns AP correspondingly disposed above each of the lower electrodes 130. In an exemplary embodiment, the lower electrodes 130 may be formed of at least one of materials, whose resistivity is lower than the substrate 110. For example, the lower electrodes 130 may include at least one of doped semiconductor, metals, conductive metal nitrides, silicides, or nano structures (such as, carbon nano tube or graphene). In an exemplary embodiment, the substrate 110 may be a silicon substrate, and the lower electrodes 130 may be a highly doped impurity region whose conductivity type is different from that of the silicon substrate. For example, the lower electrodes 130 may be formed by doping the silicon substrate with impurities whose conductivity type is different from that of the silicon substrate.

According to an exemplary embodiment, the selection structure 200 may be configured to have the same technical features as that of the previous embodiment described with reference to FIGS. 2 through 4.

Figure 7:
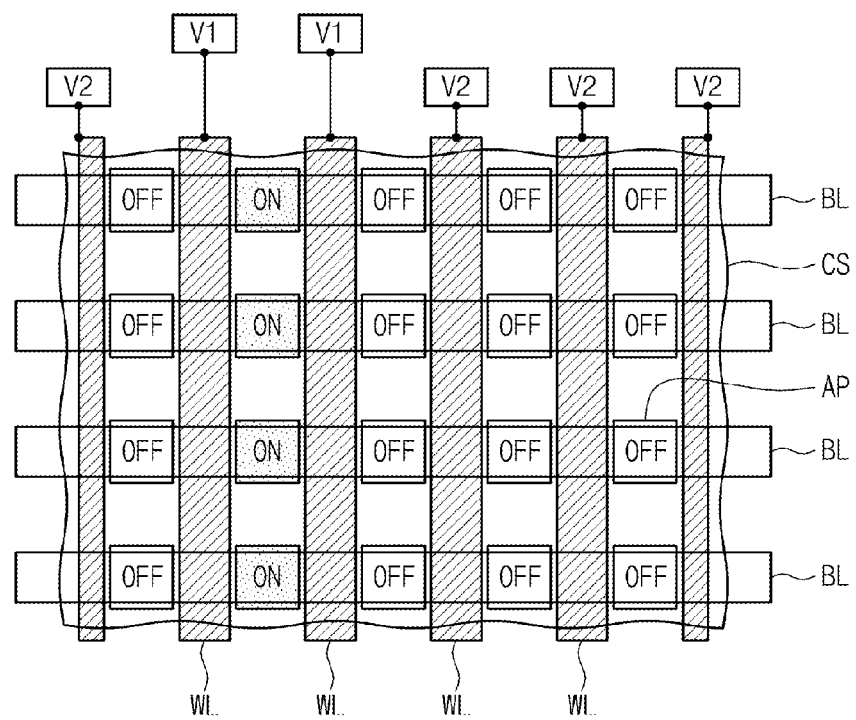

FIG. 7 is a plan view illustrating a method of operating a semiconductor memory device according to an exemplary embodiment.

According to an exemplary embodiment, as shown in FIG. 7, a first voltage V1 may be applied to adjacent two of the word lines WL, and a second voltage V2 may be applied to the other word lines WL. The first voltage V1 may be selected within a voltage range allowing the active patterns AP, which are interposed between the adjacent two of the word lines WL applied with the first voltage V1, to be turned on, while the second voltage V2 may be selected within a voltage range allowing the other active patterns AP to be turned off.

For example, in the case in which the channel region 210 has the same conductivity type as the upper electrode 220, the first voltage V1 may be selected to be able to induce an accumulation region in the channel region 210, and the second voltage V2 may be selected to be able to induce a depletion region in the channel region 210. In an exemplary embodiment, both of the channel region 210 and the upper electrode 220 may be n-type, and in this case, the first voltage V1 may be a positive voltage and the second voltage V2 may be a negative voltage, whose absolute value is greater than that of the first voltage V1.

By contrast, in the case in which the channel region 210 has a different conductivity type from the upper electrode 220, the first voltage V1 may be selected to be able to induce an inversion region in the channel region 210, while the second voltage V2 may be selected to be able to induce an accumulation or depletion region in the channel region 210. For example, if the channel region 210 is p-type and the upper electrode 220 is n-type, the first voltage V1 may be a positive voltage higher than a threshold voltage of the channel region 210, and the second voltage V2 may be a positive voltage less than the threshold voltage of the channel region 210, a ground voltage, or a negative voltage. For all that, the above exemplary embodiments may not be limited to the afore-described voltage conditions. For example, the exemplary embodiments can be variously modified according to, for example, a doping concentration and a conductivity type of the channel region 210 and/or a work function of a material used for the word lines WL, and these modifications will be easily realized by those of ordinary skill in the art with knowledge of the previously described exemplary embodiments.

According to an exemplary embodiment, the semiconductor memory device may further include a plate-shaped common electrode CS and bit lines BL crossing the word lines WL. The common electrode CS may be a part of one of the lower and upper structures 100 and 300, and the bit lines BL may be a part of the other. As described above, if the adjacent two of the word lines WL are applied with the first voltage V1, the plurality of active patterns AP therebetween may be turned on. Here, the common electrode CS may be applied with a third voltage V3, and one of the bit lines BL may be applied with a fourth voltage V4 that is different from the third voltage V3. Then, since the bit lines BL are disposed to cross the word lines WL, one of the turned-on active patterns AP, which is disposed below a bit line BL applied with the fourth voltage V4, may form a unique current path available between the bit lines BL and the common electrode CS.

Figure 8:
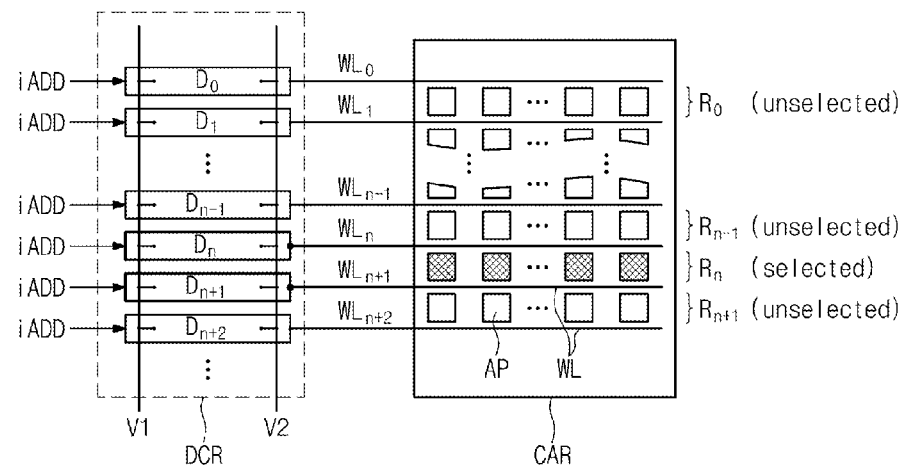
Figure 9:
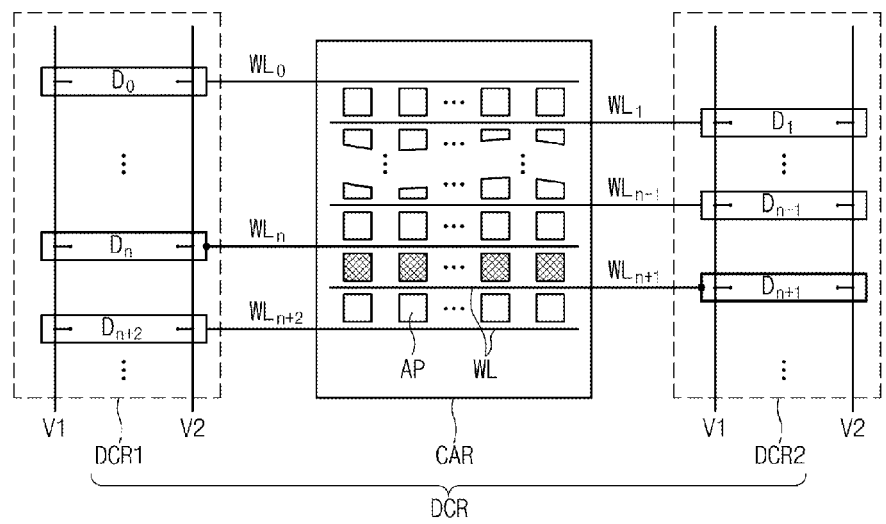
Figure 10:
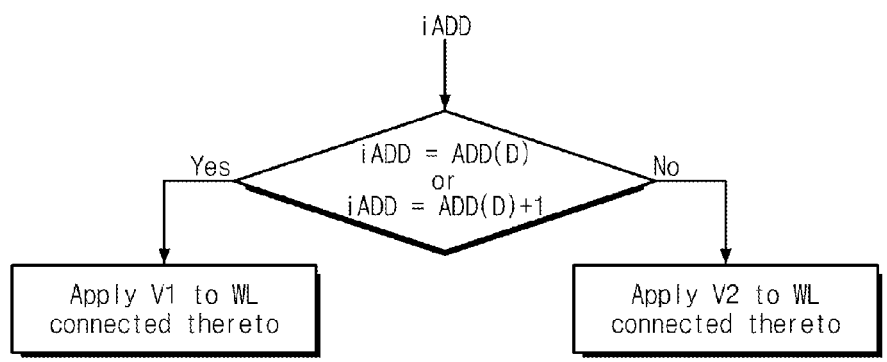

FIGS. 8 and 9 are block diagrams schematically illustrating configurations of word line decoders according to exemplary embodiments, and FIG. 10 is a flow chart illustrating one of operations, which may be performed in each word line decoder, according to an exemplary embodiments.

In addition to the cell array region CAR described with reference to FIG. 1, the semiconductor memory device according to an exemplary embodiment may include a word line decoding circuit DCR disposed adjacent to the cell array region CAR.

Referring to FIGS. 8 and 9, the word line decoding circuit DCR may include word line decoders $D_0, D_1, \ldots, D_{n-2}, D_{n-1}, D_n, D_{n+1}, D_{n+2}$, each of which is configured to control a voltage applied to the corresponding one of the word lines WL or $WL_0$-$WL_{n+2}$. Each of the word line decoders $D_0$-$D_{n+2}$ may be configured to apply one of the first and second voltages V1 and V2 to the corresponding one of the word lines WL or $WL_0$-$WL_{n+2}$, in response to an address information iADD.

As described above, according to an exemplary embodiment, the first voltage V1 may be applied to a pair of the word lines (i.e., WLn and WLn+1) which are adjacent to a desired row, e.g., Rn, of active patterns AP, while the second voltage V2 may be applied to the remaining ones of the word lines, i.e., $WL_0, WL_1, \ldots, WL_{n-2}, WL_{n-1}, WL_{n+2}$.

The word line decoders $D_0$—$D_{n+2}$ may be configured to realize this voltage applying operation on the basis of the address information iADD. For example, as shown in FIG. 10, each of the word line decoders $D_0$-$D_{n+2}$ may be configured to apply the first voltage V1, in the case when the address information iADD is greater by one than or equal to an address ADD(D) of the corresponding word line decoder, and apply the second voltage V2 in other cases, to the corresponding word line connected thereto. In other words, the above exemplary embodiments may not be limited to the example, in which the address difference is given by one, and for example, the address difference may be "−1".

In an exemplary embodiment, all of the word line decoders $D_0$-$D_{n+2}$ may be disposed at one side of the cell array region CAR, as shown in FIG. 8. In another exemplary embodiment, some (e.g., even-numbered ones) of the word line decoders $D_0$-$D_{n+2}$ may be disposed at a left side of the cell array region CAR, the remaining ones (e.g., odd-numbered ones) may be disposed at a right side of the cell array region CAR. In other words, the word line decoding circuit DCR may include first and second decoding regions DCR1 and DCR2, which are spatially separated by the cell array region CAR.

Figure 11:
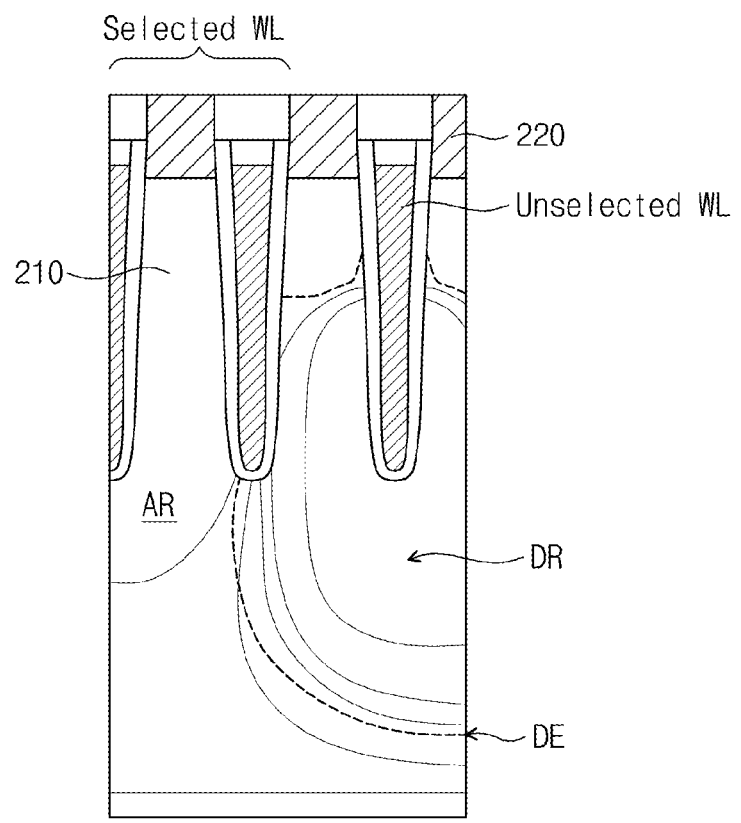
Figure 12:
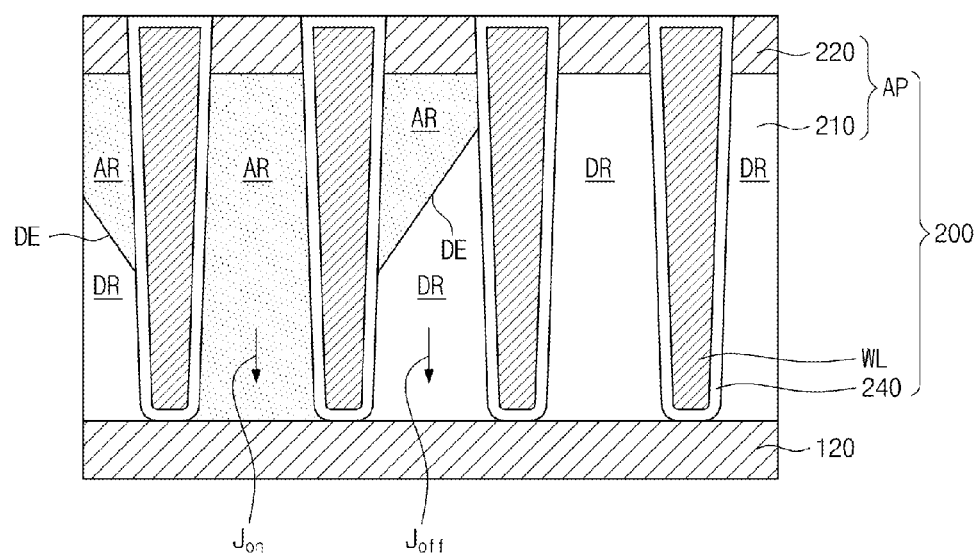

FIG. 11 is a diagram showing results of simulation on transistor characteristics of the semiconductor memory device according to an exemplary embodiment, and FIG. 12 is a schematic diagram provided to explain the result of the simulation according to another exemplary embodiment.

In the simulation, the lower electrode 120 and the upper electrode 220 were highly doped n-type diffusion regions, and the channel region 210 was a lightly doped n-type diffusion region. A selected one pair of the word lines was applied with a voltage of 1 V, and the remaining word lines were applied with a voltage of −3 V. A voltage difference between the lower and upper electrodes 120 and 220 was 0.5 V.

Referring to FIGS. 11 and 12, under the above voltage condition, an accumulated region AR was formed in a channel region 210 between the selected word lines. Since the channel region 210 had the same conductivity type as the lower and upper electrodes 120 and 220, the presence of the accumulated region AR allowed the channel region 210 between the selected word lines to be in an on state. An on-current density $J_{on}$ shown in FIG. 12 was about 1.0E+5 A/cm$^2$.

By contrast, for a channel region between one of the selected word lines and one of the unselected word lines adjacent thereto, an accumulated region AR therein was divided by a depleted region DR. For example, an interfacial surface or depletion edge DE between the depleted region DR and the accumulated region AR was transversely formed in an upper portion of the channel region, which is located between the selected word line and the unselected word line, and is extended into a substrate positioned below the selected word line. As a result, the accumulated region AR was vertically separated by the depletion region DR. The presence of the depleted region allowed the channel region to be in an off state. An off-current density $J_{off}$ shown in FIG. 12 was about 1.0E−3 A/cm$^2$. As a result, a ratio of the on-current density $J_{on}$ to the off-current density $J_{off}$ was about 1.0E+8.

The afore-explained simulation results shows that the selection structures based on the inventive concept could be effectively used as a switching device, but the above exemplary embodiment may not be limited to the specific condition used for the simulation. For example, at least one of the channel region 210, the lower electrode 120, and the upper electrode 220 can be variously modified in terms of conductivity type and/or impurity concentration, on the basis of the afore-mentioned inventive concept. In addition, the word line WL and the gate insulating pattern 240 can be variously modified in terms of material, geometrical features and so forth, on the basis of the afore-mentioned inventive concept.

In an exemplary embodiment, a ratio of a vertical length (i.e., height) to a horizontal width of the channel region 210 may range from about 3 to about 20. Similarly, a ratio of a vertical length (i.e., height) to a horizontal width of the word line WL may range from about 3 to about 20. As shown in FIG. 11, in the case in which an electric field is concentrated on a portion of the substrate situated below the word line WL, the vertical separation of the channel region caused by the depletion region DR can be more easily realized. In an exemplary embodiment, a geometrical profile of the word line WL may be designed in consideration of this electric field concentration effect.

Figure 13:
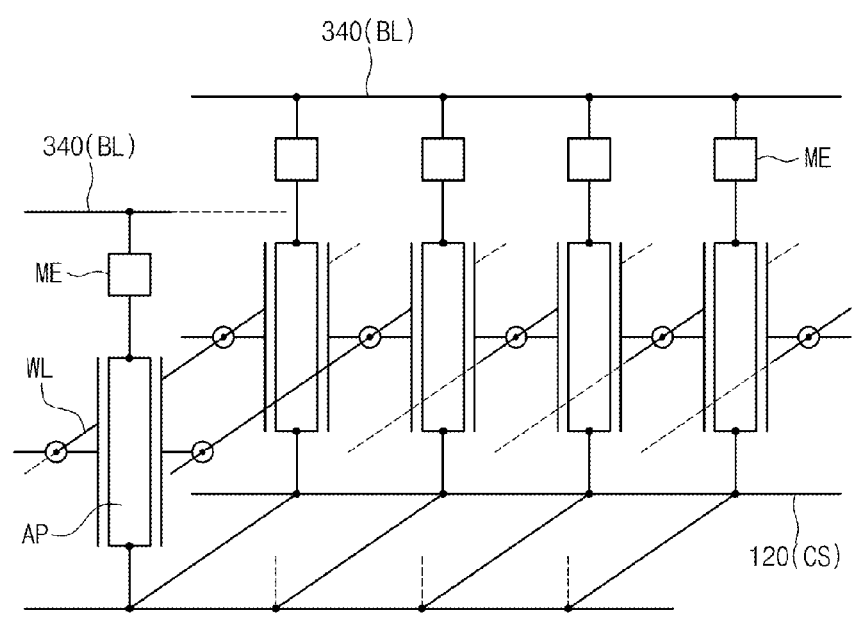
Figure 14:
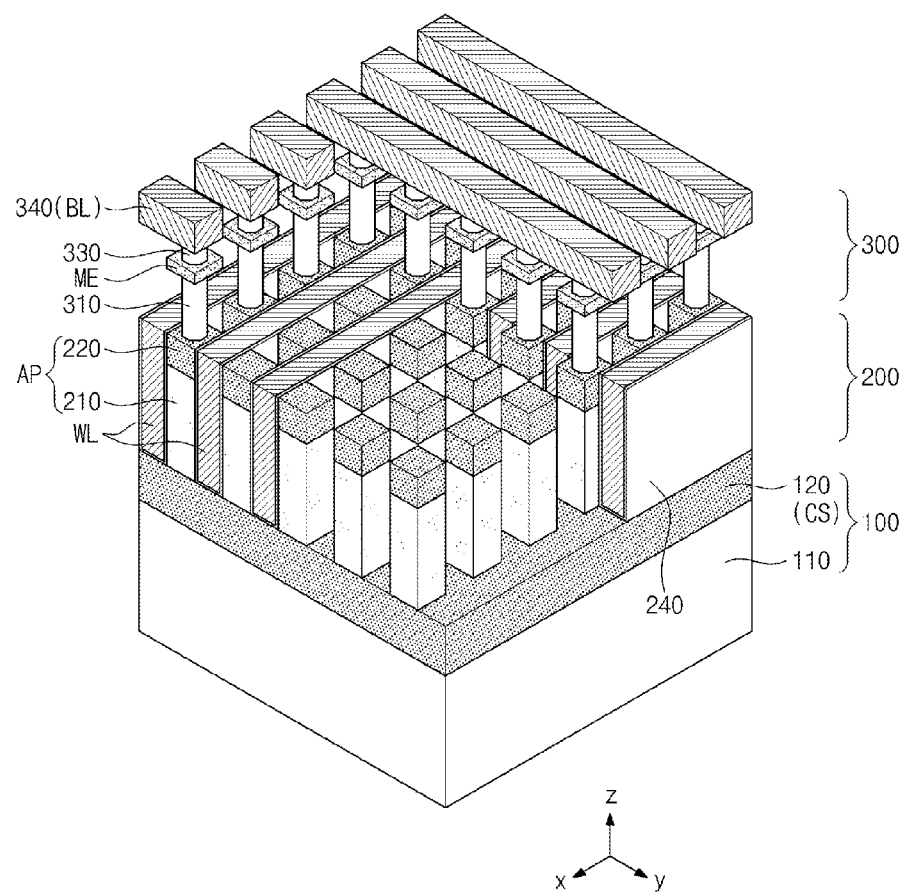

FIG. 13 is a circuit diagram schematically illustrating a portion of a cell array region of a semiconductor memory device according to an exemplary embodiment, and FIG. 14 is a perspective view illustrating an example of the semiconductor memory device of FIG. 13, according to an exemplary embodiment.

Referring to FIGS. 13 and 14, lower and selection structures 100 and 200 in the present embodiment may be configured to have the same features as those of the lower and selection structures 100 and 200 described with reference to FIGS. 2 through 4, and an upper structure 300 may include upper conductive lines 340 crossing the word lines WL and a plurality of memory elements ME interposed between the upper conductive lines 340 and the selection structure 200. Each of the memory elements ME may be electrically connected to the corresponding one of the upper electrodes 220 of the active patterns AP. For example, the memory elements ME may be two-dimensionally arranged on the selection structure 200.

The upper conductive lines 340 may serve as the bit lines BL described with reference to FIG. 7, and the lower electrode 120 of the lower structure 100 may serve as the common electrode CS described with reference to FIG. 7.

In an exemplary embodiment, all of the active patterns AP disposed in a certain region (hereinafter, first region) may be electrically connected to the corresponding memory elements ME. For example, in the first region, each of the semiconductor patterns disposed between the word lines WL may serve as a switching device controlling electric connections flowing from or to the memory elements ME. Here, the first region may be a partial or whole region of the cell array region CAR. For example, the first region may be selected to span ten or more active patterns AP sequentially arranged along both of x and y directions (i.e., a region with at least a hundred of the active patterns AP). According to an exemplary embodiment, in the whole cell array region CAR, a ratio of the total number of the active patterns AP to the total number of the memory elements ME provided in an xy plane may be from 0.9 to 1.1.

The memory element ME may include at least one data-storing material. For example, the memory element ME may include at least one of variable resistance materials of which electric resistance may be selectively changed by an electric current flowing through the memory element ME.

In an exemplary embodiment, the memory element ME may include at least one of materials, e.g., chalcogenides, of which electric resistance may be changed using thermal energy generated by an electric current flowing through the memory element ME. The chalcogenides may be a material including at least one of antimony (Sb), tellurium (Te), or selenium (Se). For example, the memory element ME may include a chalcogenide formed of tellurium (Te) having about 20 to about 80 atomic percent concentration, antimony (Sb) having about 5 to about 50 atomic percent concentration, and germanium (Ge) having the remaining concentration. In addition, the chalcogenide for the memory element ME may further include impurities of at least one of N, O, C, Bi, In, B, Sn, Si, Ti, Al, Ni, Fe, Dy, or La. In an exemplary embodiment, the memory element ME may be formed of one of GeBiTe, InSb, GeSb, and GaSb.

In an exemplary embodiment, the memory element ME may be configured to have a layered structure of which electric resistance may be changed using a spin transferring phenomenon of an electric current flowing through the memory element ME. For example, the memory element ME may be configured to have a layered structure exhibiting a magneto-resistance property and include at least one ferromagnetic material and/or at least one antiferromagnetic material.

In an exemplary embodiment, the memory element ME may include at least one of perovskite compounds or transition metal oxides. For example, the memory element ME may include at least one of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, or barium-strontium-zirconium oxide.

Furthermore, in an exemplary embodiment, the memory element ME may be formed of at least one of materials, which can exhibit a self-rectifying property or a nonlinear current-voltage property, in addition to the data-storing property. The self-rectifying property may be realized as an interfacial property between the memory element ME and the lower plug 310 or the upper plug 330. For example, the memory element ME may include at least one of transition metal oxides, and the lower plug 310 and/or the upper plug 330 may include at least one of metals or metal nitrides. In exemplary embodiments, the transition metal oxides for the memory element ME may be hafnium oxide or tantalum oxide, the lower plug 310 and/or the upper plug 330 may be one of a titanium nitride layer, a composite or double-layered structure of zirconium and titanium nitride, or a composite or multi-layered structure of zirconium/ruthenium/titanium nitride. For example, the lower plug 310, the memory element ME, and the upper plug 330 may be configured to have a multi-layered structure of TiN/HfOx/TiN, TiN/TaOx/TiN, TiN/TaOx/Zr/TiN or TiN/TaOx/Zr/Ru/TiN.

Figure 15:
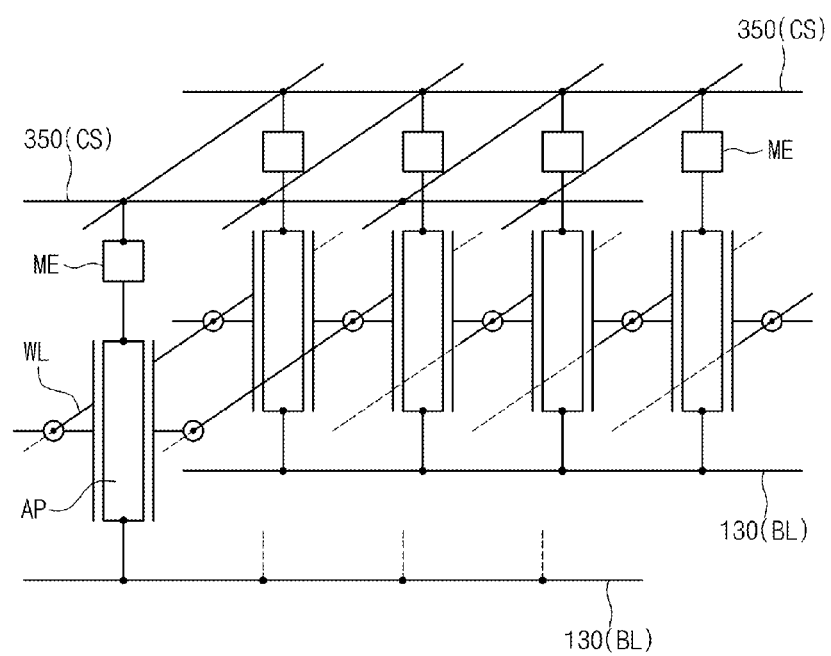
Figure 16:
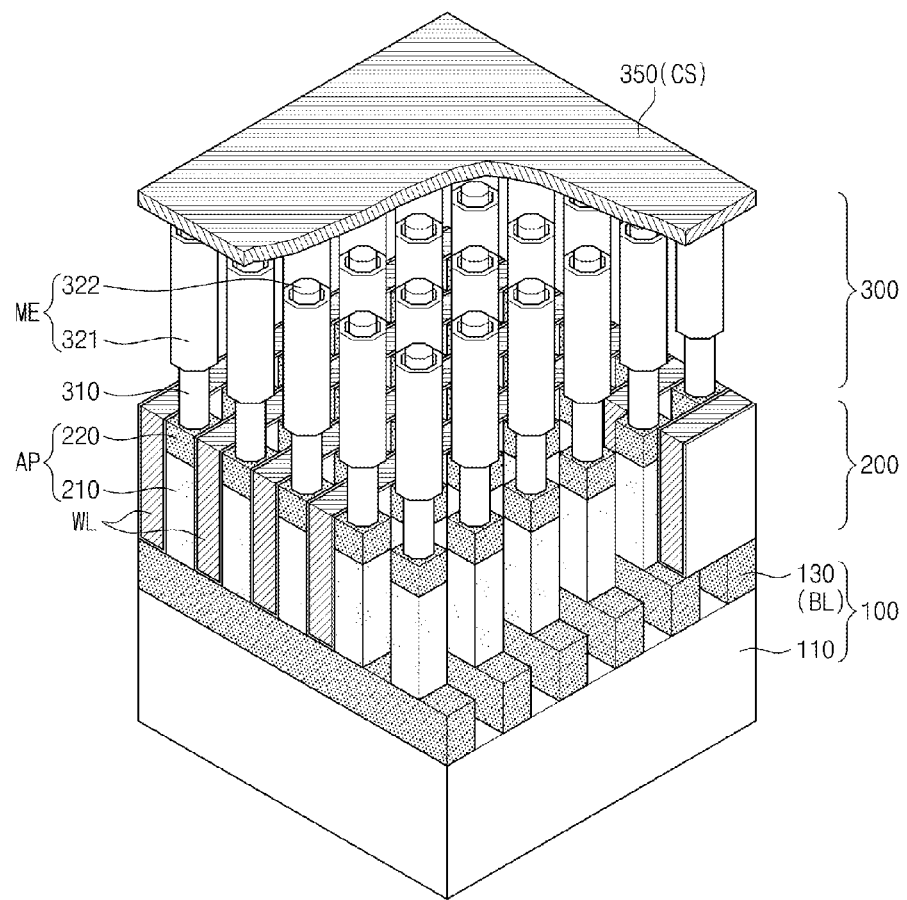

FIG. 15 is a circuit diagram schematically illustrating a portion of a cell array region of a semiconductor memory device according to an exemplary embodiment of inventive concept, and FIG. 16 is a perspective view illustrating the semiconductor memory device of FIG. 15, according to an exemplary embodiment.

Referring to FIGS. 15 and 16, lower and selection structures 100 and 200 in the present embodiment may be configured to have the same features as those of the lower and selection structures 100 and 200 described with reference to FIGS. 5 and 6, and an upper structure 300 may include an upper conductive plate 350 shaped like a plate and a plurality of memory elements ME interposed between the upper conductive plate 350 and the selection structure 200. Each of the memory elements ME may be electrically connected to the corresponding one of the upper electrodes 220 of the active patterns AP. For example, the memory elements ME may be two-dimensionally arranged on the selection structure 200.

The upper conductive plate 350 may serve as the common electrode CS described with reference to FIG. 7, and the lower electrodes 130 of the lower structure 100 may serve as the bit lines BL described with reference to FIG. 7.

In an exemplary embodiment, all of the active patterns AP disposed in a certain region (hereinafter, first region) may be electrically connected to the corresponding memory elements ME. For example, in the first region, each of the semiconductor patterns disposed between the word lines WL may serve as a switching device controlling electric connections flowing from or to the memory elements ME. Here, the first region may be a partial or whole region of the cell array region CAR. For example, the first region may be selected to span ten or more active patterns AP sequentially arranged along both of x and y directions (i.e., a region with at least a hundred of the active patterns AP). According to an exemplary embodiment, in the whole cell array region CAR, a ratio of the total number of the active patterns AP to the total number of the memory elements ME provided in an xy plane may be from 0.9 to 1.1.

The memory element ME may include at least one data-storing material. For example, as shown in FIG. 16, the memory element ME may be a capacitor including a first electrode 321 shaped like a cup, a second electrode 322 inserted into the first electrode 321, and a dielectric layer separating the first electrode 321 electrically from the second electrode 322.

Figure 17:
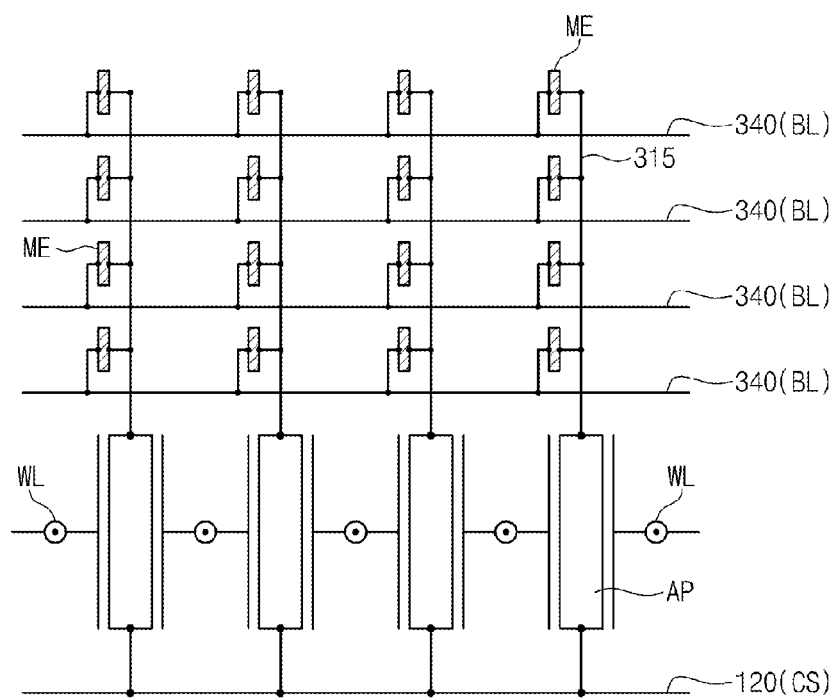
Figure 18:
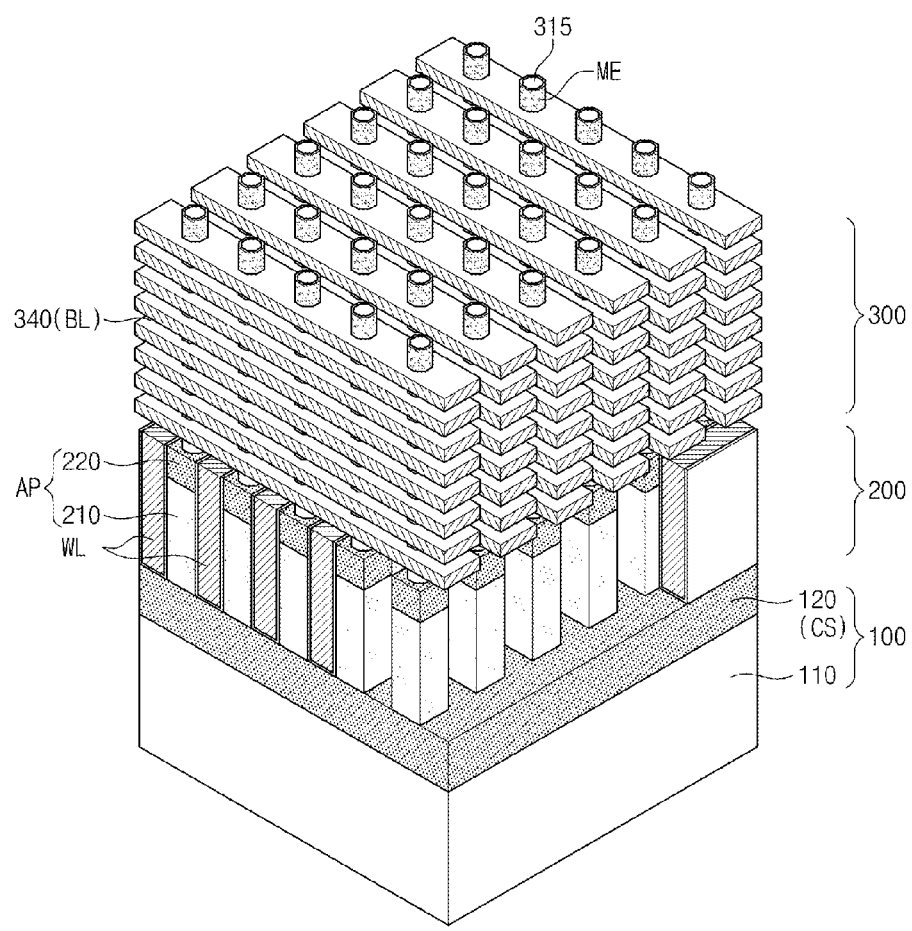

FIG. 17 is a circuit diagram illustrating a portion of a cell array of a semiconductor memory device according to an exemplary embodiment, and FIG. 18 is a perspective view illustrating the semiconductor memory device of FIG. 17, according to an exemplary embodiment.

Referring to FIGS. 17 and 18, lower and selection structures 100 and 200 in the present embodiment may be configured to have the same features as those of the lower and selection structures 100 and 200 described with reference to FIGS. 2 through 4, and an upper structure 300 may include a plurality of vertical electrodes 315, upper conductive lines 340 crossing the vertical electrodes 315, and a plurality of memory elements ME interposed between the vertical electrodes 315 and the upper conductive lines 440. The vertical electrodes 315 may be connected to top surfaces of the active patterns AP, respectively.

Each of the vertical electrodes 315 may have a longitudinal axis perpendicular to the selection structure 200 and be electrically connected to the corresponding one of the upper electrodes 220 of the active patterns AP. The upper conductive lines 340 may be disposed to cross the word lines WL and serve as the bit lines BL described with reference to FIG. 7, and the lower electrode 120 of the lower structure 100 may serve as the common source CS described with reference to FIG. 7. In an exemplary embodiment, the upper conductive lines 340 may be arranged on a plurality of xy planes of which vertical levels are different from one another, and a plurality of the upper conductive lines 340 may be two-dimensionally disposed on each of the xy planes. As a result, the upper conductive lines 340 may be three-dimensionally arranged to cross the word lines WL.

The memory elements ME may be interposed between the upper conductive lines 340 and the selection structure 200 in vertical position and between sidewalls of the vertical electrodes 315 and the upper conductive lines 340 in horizontal position. Accordingly, the memory elements ME may be three-dimensionally arranged on the selection structure 200, similar to the upper conductive lines 340.

In an exemplary embodiment, all of the active patterns AP disposed in a certain region (hereinafter, first region) may be electrically connected to the corresponding vertical electrodes 315. In the first region, each of the semiconductor patterns disposed between the word lines WL may serve as a switching device controlling electric connections flowing from or to the memory elements ME. Here, the first region may be a partial or whole region of the cell array region CAR. For example, the first region may be selected to span ten or more active patterns AP sequentially arranged along both of x and y directions (i.e., a region with at least a hundred of the active patterns AP). According to an exemplary embodiment, in the whole cell array region CAR, a ratio of the total number of the active patterns AP to the total number of the vertical electrodes 315 may be from 0.9 to 1.1.

The memory element ME may include at least one data-storing material. For example, the memory element ME may include at least one of variable resistance materials (e.g., chalcogenides), layered structures exhibiting a magneto-resistance property, perovskite compounds, or transition metal oxides.

Figure 19:
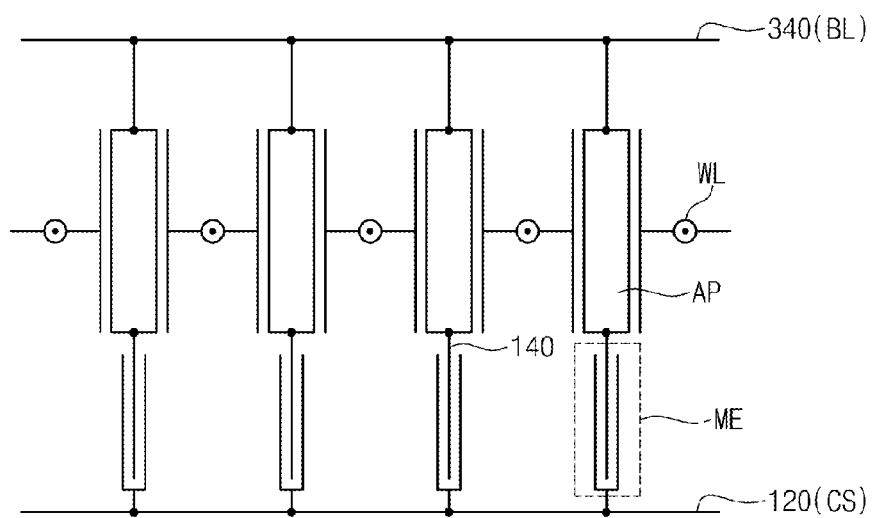
Figure 20:
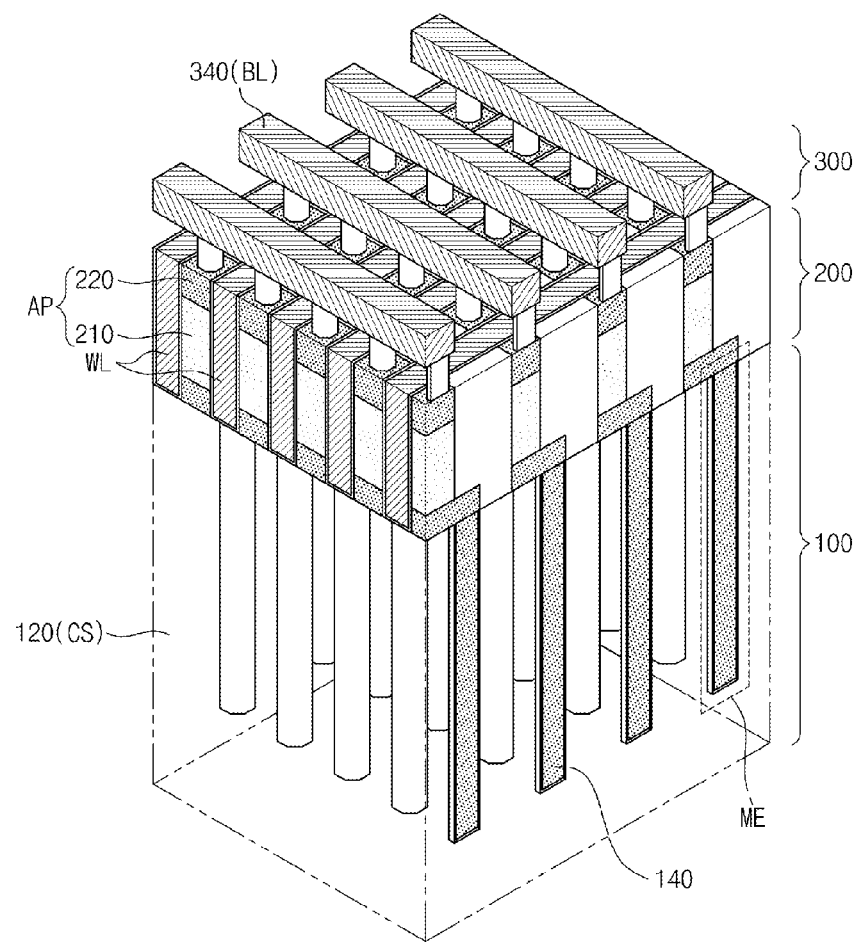

FIG. 19 is a circuit diagram illustrating a portion of a cell array of a semiconductor memory device according to an exemplary embodiment, and FIG. 20 is a perspective view illustrating the semiconductor memory device of FIG. 19, according to an exemplary embodiment.

Referring to FIGS. 19 and 20, a selection structure 200 in the present embodiment may be configured to have the same features as those of the selection structure 200 described with reference to FIGS. 2 through 4, and an upper structure 300 may include upper conductive lines 340 crossing the word lines WL, and a lower structure 100 may include a plurality of memory elements ME provided in the substrate 110 and a lower electrode 120 coupled to the memory elements ME. In other words, the memory elements ME may be interposed between the selection structure 200 and the lower electrode 120.

In an exemplary embodiment, as shown in FIG. 20, the memory element ME may be a trench-type capacitor including a plug-shaped electrode 140 connected to the active pattern AP, the lower electrode 120, and a dielectric layer interposed therebetween.

Applications of Embodiments

Figure 21:
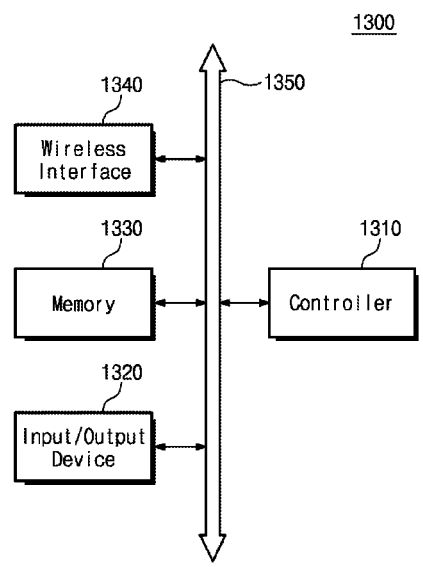
Figure 22:
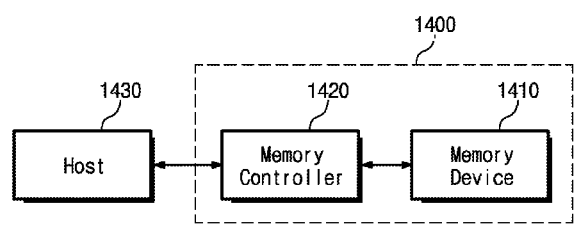

FIGS. 21 and 22 are block diagrams schematically illustrating electronic devices including a semiconductor device according to exemplary embodiments.

Referring to FIG. 21, an electronic device 1300 including a semiconductor device described in the above exemplary embodiments may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to one another through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device described in the above exemplary embodiments. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 22, a memory system including a semiconductor device described in the above exemplary embodiments will be described. The memory system 1400 may include a memory device 1410 for storing huge amounts of data and a memory controller 1420. The memory controller 1420 controls the memory device 1410 to read data stored in the memory device 1410 or to write data into the memory device 1410 in response to a read or write request of a host 1430. The memory controller 1420 may include an address mapping table for mapping an address provided from the host 1430 (e.g., a mobile device or a computer system) into a physical address of the memory device 1410. The memory device 1410 may be a semiconductor device described in the above exemplary embodiments.

The semiconductor memory devices disclosed above may be encapsulated using various and diverse packaging techniques. For example, the semiconductor memory devices described in the above exemplary embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

According to the above exemplary embodiments, switching devices in a cell array region may be configured to have a cell size of about 4F2, without a reduction in occupying areas of an active region and a gate region. As a result, it is possible to realize a high density semiconductor memory device. According to the above exemplary embodiments, the switching device may be provided as a form of transistor, and this enables to realize a bi-directional current characteristic in switching operations. As a result, the selection structure according to the above exemplary embodiments can be used to realize semiconductor memory devices, in which the bi-directional current characteristic is required.

While exemplary embodiments have been particularly shown and described, it will be understood by one of ordinary skill in the art that variations in form and detail may be made therein without departing from the spirit and scope of the attached claims.

What is claimed is:

1. A semiconductor memory device, comprising:
   a cell array region comprising a lower structure, an upper structure, and a selection structure, the selection structure being interposed between the lower and upper structures and comprising a plurality of word lines; and
   a decoding circuit controlling voltages applied to the word lines,
   wherein the decoding circuit is configured to apply a first voltage to a pair of the word lines adjacent to each other and to apply a second voltage different from the first voltage to remaining ones of the word lines, in response to word line address information input thereto.

2. The device of claim 1, wherein the decoding circuit comprises a plurality of decoders, each of which is configured to apply the first voltage to a corresponding one of the word lines, if the word line address information input thereto is greater by one than or equal to address information of the each decoder, and to apply the second voltage to the corresponding one of the word lines if the word line address information input thereto is less than the address information of the each decoder.

3. The device of claim 1, wherein the lower structure comprises a semiconductor substrate and a lower doped region provided above the semiconductor substrate, and the selection structure further comprises a plurality of active patterns arranged on the lower structure, and
   wherein each of the active patterns comprises:
      an upper impurity region having the same conductivity type as the lower doped region; and
      a channel region interposed between the upper impurity region and the lower doped region.

4. The device of claim 3, wherein a ratio of a vertical length of the channel region to a horizontal width thereof ranges from about 3 to about 20.

5. The device of claim 3,
   wherein the first and second voltages have different signs from each other, and an absolute value of the first voltage is smaller than an absolute value of the second voltage.

6. The device of claim 1, wherein one of the lower and upper structures comprises a common electrode, and the other comprises a plurality of memory elements and a plurality of bit lines, and
   wherein the selection structure is located between the common electrode and the memory elements, in vertical position.

7. The device of claim 1, wherein the upper structure comprises a plurality of memory elements and a plurality of bit lines, and the selection structure further comprises a plurality of active patterns arranged on the lower structure, and
   wherein the word lines are disposed between the active patterns to cross the bit lines, and the lower structure comprises a common electrode, to which the active patterns are coupled.

8. The device of claim 7, wherein the upper structure further comprises a plurality of vertical electrodes, each of which is coupled to a corresponding one of the active patterns, and the memory elements are provided at intersections between the vertical electrodes and the bit lines, respectively.

9. The device of claim 8, wherein all of the memory elements are substantially provided on a single plane parallel to a top surface of the lower structure, and the bit lines are disposed on the memory elements.

10. The device of claim 8, wherein the memory elements are three-dimensionally arranged on a plurality of planes parallel to a top surface of the lower structure,
    wherein the bit lines are provided to cross sidewalls of the vertical electrodes, and
    wherein the memory elements are provided between sidewalls of the bit lines and the vertical electrodes.

11. The device of claim 8, wherein, in the cell array region, a ratio of a total number of the active patterns to a total number of the vertical electrodes ranges from 0.9 to 1.1.

12. The device of claim 7, wherein the memory elements comprises at least one of chalcogenides, at least one of layered structures configured to exhibit a magneto-resistance property, at least one of perovskite compounds, or at least one of transition metal oxides.

13. A semiconductor memory device, comprising:
    a lower structure comprising a lower electrode;
    an upper structure comprising a plurality of memory elements and a plurality of bit lines;
    a selection structure provided between the lower and upper structures and comprising a plurality of word lines; and
    a plurality of word line decoders controlling voltages applied to the word lines, wherein each of the word line decoders is configured to apply a first or second voltage to a corresponding one of the word lines connected thereto in response to word line address information input thereto, wherein the first voltage is used if the word line address information input thereto is greater by one than or equal to address information of the each word line decoder, and the second voltage is different from the first voltage and is used if the word line address information input thereto is less than the address information of the each word line decoder.

14. The device of claim 13, wherein the first and second voltages have different signs from each other, and an absolute value of the first voltage is smaller than an absolute value of the second voltage.

15. The device of claim 13, wherein the selection structure comprises a plurality of active patterns arranged on the lower structure, and each of the active patterns comprises an upper electrode and a channel region interposed between the lower and upper electrodes, and wherein the channel region has the same conductivity type as the lower and upper electrodes.

16. The device of claim 15, wherein a ratio of a vertical length of the channel region to a horizontal width thereof ranges from about 3 to about 20.

17. The device of claim 13, wherein the memory elements are arranged in a two-dimensional or three-dimensional manner.

18. The device of claim 13, wherein the memory elements comprises at least one of chalcogenides, at least one of layered structures configured to exhibit a magneto-resistance property, at least one of perovskite compounds, or at least one of transition metal oxides.

19. A semiconductor memory device, comprising:
a lower structure comprising a lower electrode;
an upper structure comprising a plurality of memory elements and a plurality of bit lines; and
a selection structure provided between the lower and upper structures,
wherein the selection structure comprises:
a plurality of active patterns arranged on the lower structure; and
a plurality of word lines provided between the active patterns to cross the bit lines,
wherein each of the active patterns comprises a channel region and an upper electrode sequentially stacked on the lower electrode, and
wherein the channel region has the same conductivity type as the upper and lower electrodes.

20. The device of claim 19, further comprising, a plurality of word line decoders, each of which is configured to apply a first or second voltage to a corresponding one of the word lines connected thereto, in response to word line address information input thereto, wherein the first voltage is used if the word line address information input thereto is greater by one than or equal to address information of the each word line decoder, and the second voltage is different from the first voltage and is used if the word line address information input thereto is less than the address information of the each word line decoder.

21. The device of claim 20, wherein the first and second voltages have different signs from each other, and an absolute value of the first voltage is smaller than an absolute value of the second voltage.

22. The device of claim 19, wherein a ratio of a vertical length of the channel region to a horizontal width thereof ranges from about 3 to about 20.

23. The device of claim 19, wherein the memory elements are arranged in a two-dimensional or three-dimensional manner.

24. The device of claim 19, wherein the memory elements comprises at least one of chalcogenides, at least one of layered structures configured to exhibit a magneto-resistance property, at least one of perovskite compounds, or at least one of transition metal oxides.

25. A semiconductor memory device, comprising:
a plurality of memory elements;
a lower structure comprising at least one lower electrode;
an upper structure;
a selection structure provided between the lower and upper structures, and comprising:
a plurality of active patterns arranged above the lower structure; and
a plurality of word lines provided between the active patterns;
a plurality of bit lines crossing the word lines,
wherein each of the active patterns comprises a channel region and an upper electrode stacked above the lower structure,
wherein the world lines and the channel region are connected to the lower electrode,
wherein the memory elements are connected to the lower electrode or the upper electrodes of the active patterns, and
wherein the bit lines are connected to the upper electrodes or the channel regions of the active patterns.

26. The device of claim 25, wherein the active patterns are formed in a given number of rows and columns, and disposed above the lower electrode,
wherein each row of the active patterns is separated from a next row of the active patterns by a corresponding word line of the word lines, and, in a same row of the active patterns, an active pattern is separated from a next active pattern by a device isolation pattern.

27. The device of claim 26, wherein each of the bit lines crosses the world lines such that each bit line is disposed over or below a corresponding column of the active patterns.

28. The device of claim 26, wherein a width of the active pattern in the row direction is the same as a width of the device isolation pattern in the row direction.

29. The device of claim 28, wherein a width of the active pattern in the column direction is the same as a width of the device isolation pattern in the column direction.

30. The device of claim 25, wherein the channel region has the same conductivity type as the upper and lower electrodes, and has an impurity concentration lower than the upper and lower electrodes.

31. The device of claim 25, further comprising a decoding circuit controlling voltages applied to the word lines,
wherein the decoding circuit is configured to apply a first voltage to a pair of the word lines adjacent to each other and to apply a second voltage different from the first voltage to remaining ones of the word lines, in response to word line address information input thereto.

32. The device of claim 25, wherein a ratio of a vertical length of the channel region to a horizontal width of the channel region ranges from about 3 to about 20.

* * * * *